United States Patent
Lee

(10) Patent No.: US 10,921,853 B2
(45) Date of Patent: Feb. 16, 2021

(54) DISPLAY DEVICE AND METHOD OF FABRICATING THE SAME

(71) Applicant: Samsung Display Co., LTD., Yongin-si (KR)

(72) Inventor: Lu Ly Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/803,456

(22) Filed: Feb. 27, 2020

(65) Prior Publication Data

US 2020/0348722 A1 Nov. 5, 2020

(30) Foreign Application Priority Data

Apr. 30, 2019 (KR) .......................... 10-2019-0050561

(51) Int. Cl.
*G06F 1/16* (2006.01)
*G02B 1/16* (2015.01)

(52) U.S. Cl.
CPC ............. *G06F 1/1609* (2013.01); *G02B 1/16* (2015.01); *G06F 1/1626* (2013.01); *G06F 1/1652* (2013.01)

(58) Field of Classification Search
CPC combination set(s) only.
See application file for complete search history.

(56) References Cited

U.S. PATENT DOCUMENTS

| 7,327,430 | B2* | 2/2008 | Lee ................... G02F 1/133308 349/150 |
| 7,535,537 | B2* | 5/2009 | Lee ................... G02F 1/133308 349/150 |
| 7,843,526 | B2* | 11/2010 | Lee .......................... H05K 5/02 349/58 |
| 9,215,834 | B2* | 12/2015 | Cheng ................... H01R 12/592 |
| 9,618,688 | B2* | 4/2017 | Choi ..................... G02B 6/0083 |
| 9,778,705 | B2* | 10/2017 | Esmaeili ............... G06F 1/1684 |
| 2020/0022261 | A1* | 1/2020 | Choi ..................... G06F 3/0412 |
| 2020/0196492 | A1* | 6/2020 | Kim ................... H05K 7/20436 |
| 2020/0209690 | A1* | 7/2020 | Park ................... G02F 1/133707 |
| 2020/0260612 | A1* | 8/2020 | Park ..................... H05K 7/2039 |

FOREIGN PATENT DOCUMENTS

| KR | 1020080035784 | 4/2008 |
| KR | 1020130044405 | 5/2013 |
| KR | 1020150071364 | 6/2015 |
| KR | 101824219 | 1/2018 |

* cited by examiner

*Primary Examiner* — Lisa Lea-Edmonds
(74) *Attorney, Agent, or Firm* — Cantor Colburn LLP

(57) ABSTRACT

A display device and a method for fabricating the same are provided. The display device includes a display panel, a first circuit board which has a first end attached onto the display panel, a driver integrated circuit which is disposed on the first circuit board, a sealing member disposed on the first circuit board and which surrounds an outer surface of the driver integrated circuit, and an insulating tape which is disposed on the sealing member and the driver integrated circuit.

20 Claims, 20 Drawing Sheets

FIG. 3
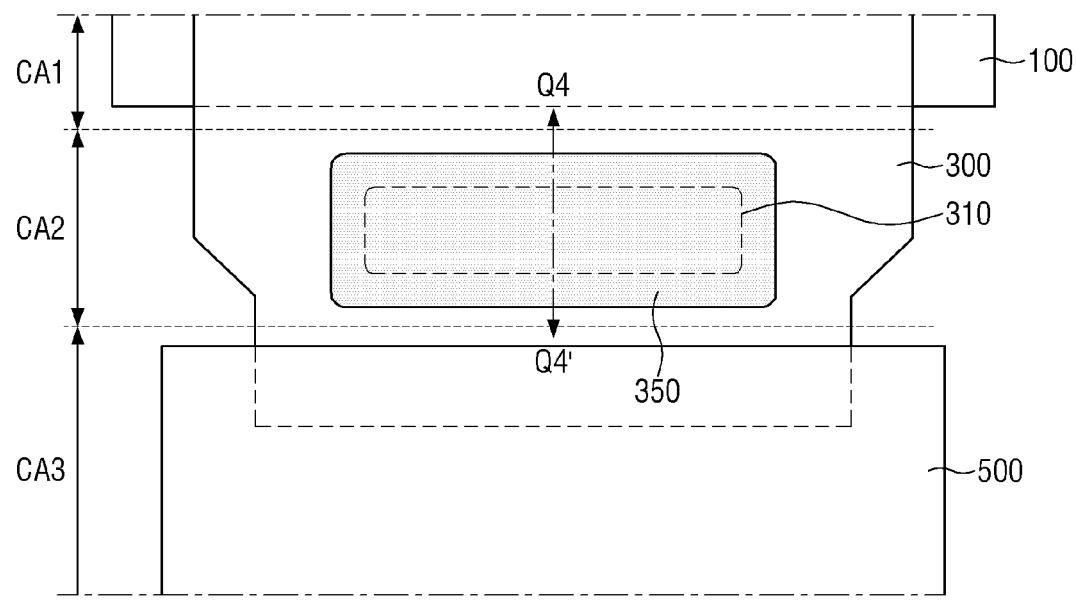
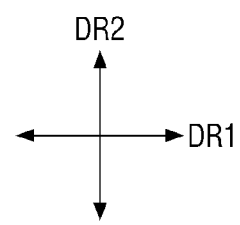

FIG. 19
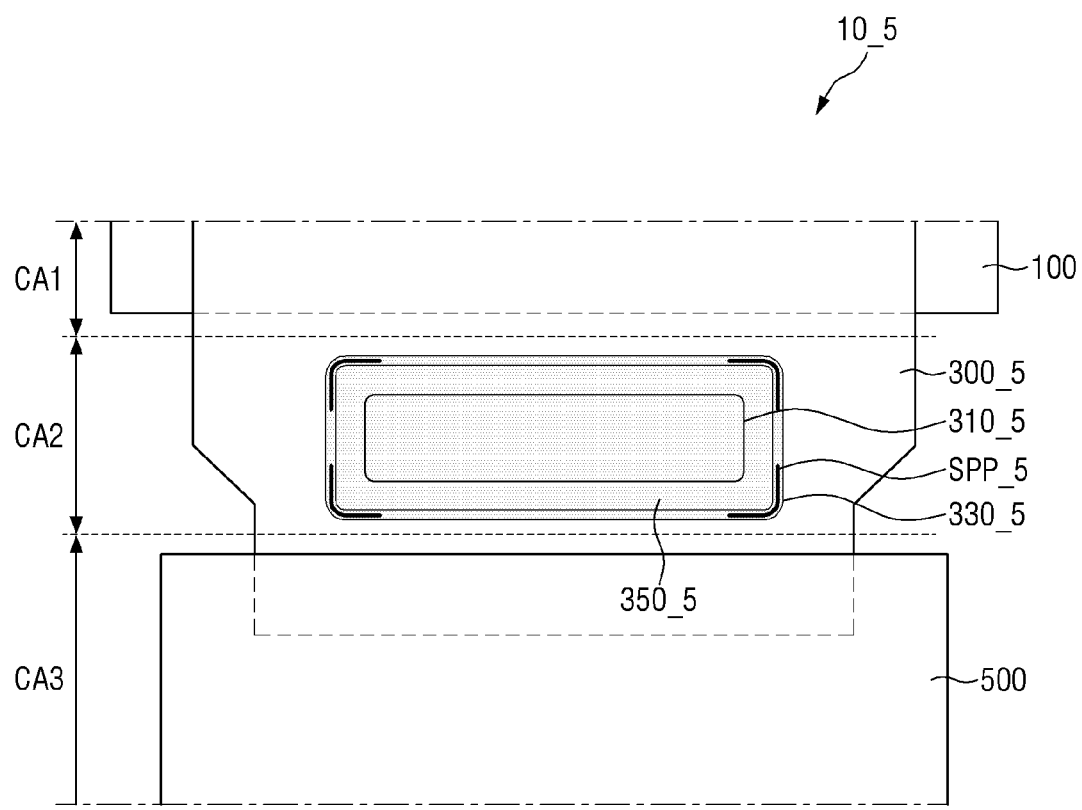
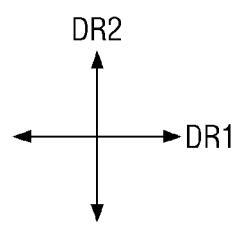

DISPLAY DEVICE AND METHOD OF FABRICATING THE SAME

This application claims priority to Korean Patent Application No. 10-2019-0050561, filed on Apr. 30, 2019, and all the benefits accruing therefrom under 35 U.S.C. § 119, the content of which in its entirety is herein incorporated by reference.

BACKGROUND

1. Field

The present disclosure relates to a display device and a method of fabricating the same.

2. Description of the Related Art

A display device is becoming increasingly important with the development of multimedia. Accordingly, various types of display devices such as organic light emitting displays ("OLEDs") and liquid crystal displays ("LCDs") are being used. These display devices are being applied to an increasingly wide variety of devices, mainly to various mobile electronic devices, for example, portable electronic devices such as smartphones, smart watches, and tablet personal computers ("PCs").

The display device may include a flexible film to or on which a circuit board or an integrated circuit for controlling the driving of a display panel is attached or disposed. A tape for preventing static electricity that can be generated in the integrated circuit may be disposed on the flexible film. The anti-static tape may be attached onto the flexible film to cover the integrated circuit, etc.

SUMMARY

Aspects of the present disclosure provide a display device which includes a structure for compensating for a step formed by a driver integrated circuit disposed on a flexible film and an antistatic tape disposed to cover the structure.

Aspects of the present disclosure also provide a method of fabricating a display device. The method includes a method of forming a structure for compensating for a step formed by a driver integrated circuit.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an exemplary embodiment of the present disclosure, a display device includes a display panel, a first circuit board which has a first end attached onto the display panel, a driver integrated circuit which is disposed on the first circuit board, a sealing member disposed on the first circuit board and which surrounds an outer surface of the driver integrated circuit, and an insulating tape which is disposed on the sealing member and the driver integrated circuit.

In an exemplary embodiment, the insulating tape may overlap the driver integrated circuit and be attached onto at least a part of an upper surface of the sealing member.

In an exemplary embodiment, a side surface of the insulating tape may form a level surface with a side surface of the sealing member.

In an exemplary embodiment, a height of the sealing member may be greater than a height measured from an upper surface of the first circuit board to an upper surface of the driver integrated circuit.

In an exemplary embodiment, at least a part of an upper surface of the insulating tape may be sunken into the driver integrated circuit, and a lower surface of the sunken part may contact the upper surface of the driver integrated circuit.

In an exemplary embodiment, the display device may further include a protective resin which is disposed between the insulating tape and the first circuit board in an area surrounded by the sealing member.

In an exemplary embodiment, the protective resin may be disposed between the driver integrated circuit and the sealing member.

In an exemplary embodiment, the protective resin may be disposed between the upper surface of the driver integrated circuit and the insulating tape.

In an exemplary embodiment, the display device may further include a second circuit board which is attached onto a second end, opposite the first end, of the first circuit board.

In an exemplary embodiment, the second circuit board may be spaced apart from the sealing member.

In an exemplary embodiment, the second circuit board may surround one side of the sealing member and both sides, connected to both ends of the one side, of the sealing member and may be spaced apart from the one side and the both sides.

In an exemplary embodiment, the display device may further include a print layer which is formed on the first circuit board to be spaced apart from the driver integrated circuit, and at least a part of the print layer may surround the outer surface of the driver integrated circuit, and at least portion of the sealing member partially overlaps the print layer.

In an exemplary embodiment, the print layer may comprise one or more print patterns, and the print patterns may be spaced apart from each other and face the outer surface of the driver integrated circuit.

In an exemplary embodiment, the sealing member may comprise a first area overlapping a print pattern of the one or more print patterns and a second area adjacent to the first area and not overlapping the one or more print patterns.

According to another exemplary embodiment of the present disclosure, a display device includes a display panel which comprises a display area, a non-display area surrounding the display area, and a coupling area disposed on a side of the non-display area, a first circuit board which has a first end attached onto the coupling area of the display panel, a second circuit board which is attached onto a second end opposite the first end of the first circuit board, a driver integrated circuit which is disposed on the first circuit board to be spaced apart from the second circuit board, a print layer which is formed on the first circuit board to surround the driver integrated circuit at a distance from the driver integrated circuit, a sealing member which is disposed on the print layer to surround the driver integrated circuit and disposed between the driver integrated circuit and the second circuit board, an insulating tape which is disposed on the sealing member and the driver integrated circuit, and a protective resin which is disposed between the insulating tape and the first circuit board in an area surrounded by the sealing member.

In an exemplary embodiment, the insulating tape may overlap the driver integrated circuit and be attached onto at least a part of an upper surface of the sealing member.

In an exemplary embodiment, the second circuit board may surround one side of the sealing member and both sides, connected to both ends of the one side, of the sealing member and is spaced apart from the one side and the both sides.

According to an exemplary embodiment of the present disclosure, a method for fabricating a display device includes preparing a first circuit board having a print layer formed on at least a part of the first circuit board, placing a driver integrated circuit in an area surrounded by the print layer and forming a sealing member on the print layer, and injecting a protective resin into an area surrounded by the sealing member and placing an insulating tape on the sealing member and the driver integrated circuit.

In an exemplary embodiment, the forming of the sealing member may include moving a camera, which senses a position of the print layer formed on the first circuit board, along the print layer, and injecting a sealant onto the print layer using a first nozzle moving in the same direction as the camera.

In an exemplary embodiment, in the placing of the insulating tape, the insulating tape may be attached to at least a part of an upper surface of the sealing member.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 3 is a plan view of a first circuit hoard according to an exemplary embodiment;

FIG. 19 is a partial plan view of a first circuit board of a display device according to another exemplary embodiment.

DETAILED DESCRIPTION

The present invention will now be described more fully hereinafter with reference to the accompanying drawings, in which preferred exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments will be described with reference to the attached drawings.

Figure 1:
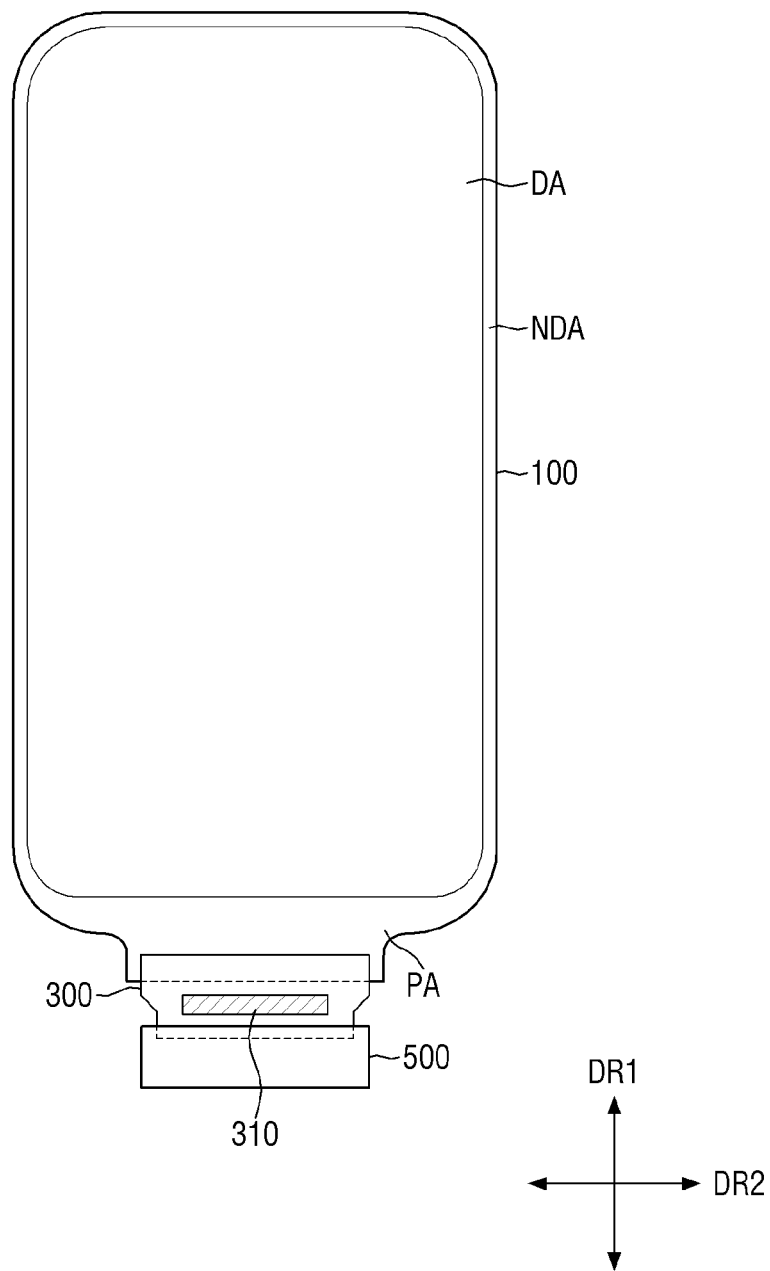
FIG. 1 is a plan view of a display device according to an exemplary embodiment.

FIG. 1 is a plan view of a display device 10 according to an exemplary embodiment.

Referring to FIG. 1, the display device 10 displays moving images or still images. The display device 10 may refer to any electronic device that provides a display screen. Examples of the display device 10 as a device for providing a display screen may include, but are not limited to, a television, a notebook computer, a monitor, a billboard, the Internet of things ("IoT"), a mobile phone, a smartphone, a tablet personal computer ("PC"), an electronic watch, a smart watch, a watch phone, a head mounted display, a mobile communication terminal, an electronic notebook, an electronic book, a personal digital assistant ("PDA"), a portable multimedia player ("PMP"), a navigation device, a game machine, a digital camera, a camcorder, a wristwatch-type electronic device, a monitor of a PC, a car dashboard, an external billboard, an electronic board, various medical devices, various examination devices, various home appliances including a display area DA, such as a refrigerator and a washing machine, and IoT devices.

The display device 10 includes a display panel 100, a first circuit board 300, and a second circuit board 500.

The display panel 100 provides a display screen of the display device 10. Examples of the display panel 100 include a light emitting diode ("LED") display panel, an organic light emitting display panel, a quantum dot light emitting display panel, a plasma display panel, and a field emission display panel. A case where an LED display panel is applied as an example of the display panel 100 will be described below, but the invention is not limited to this example, and other display panels can also be applied as long as the same technical spirit is applicable.

The display panel 100 may be substantially rectangular in a plan view. The display panel 100 may be shaped like a rectangle with right-angled corners or a rectangle with rounded corners in the plan view. The display panel 100 may include four sides or edges. The display panel 100 may include long sides and short sides. Here, a length of the long sides is longer than a length of the short sides. The display panel 100 may include a coupling area PA which protrudes from a part of a lower side among the four sides of the display panel 100 and to which the first circuit board 300 is attached.

However, the shape of the display device 10 is not limited to this example and can be changed to various shapes. For example, the display device 10 may have various shapes such as a horizontally long rectangle, a vertically long rectangle, a square, a quadrilateral with rounded corners (i.e., vertices), other polygons, and a circle. The shape of a display area DA of the display device 10 may also be similar to the overall shape of the display device 10. In FIG. 1, the display device 10 and the display area DA are shaped like vertically long rectangles.

In the plan view, the display device 10 may be divided into the display area DA where an image or video is displayed and a non-display area NDA disposed around the display area DA. The display area DA may be an area where a screen is included, and the non-display area NDA may be an area where no screen is included. The display area DA may also be referred to as an active area, and the non-display area NDA may also be referred to as an inactive area. The display area DA may generally occupy the center of the display device 10. The non-display area NDA may be an area other than the display area DA and may surround the display area DA. However, the invention is not limited to these examples.

The display area DA may include a plurality of pixels. Each of the pixels is a basic unit for displaying an image on a screen. The pixels may be, but are not limited to, red pixels, green pixels, and blue pixels. The pixels may further include white pixels. The pixels may be alternately arranged in the plan view. For example, the pixels may be arranged in a matrix direction.

The non-display area NDA may be disposed around the display area DA. The non-display area NDA may surround the display area DA. In an exemplary embodiment, the display area DA may be formed in a rectangular shape, and the non-display area NDA may be disposed around four sides of the display area DA. A black matrix may be disposed in the non-display area NDA to prevent the leakage of light emitted from adjacent pixels.

The display panel 100 may include the coupling area PA disposed on a side of the non-display area NDA. In the coupling area PA, pads connected to a plurality of wirings disposed in the display area DA may be placed. The pads connected to the plurality of wirings may be connected to pads of the first circuit board 300 (to be described later) and may receive predetermined electrical or control signals. Although the lower side of the display panel 100 protrudes to form the coupling area PA in the drawing, the invention is not limited to this case. In addition, the pads connected to the plurality of wirings may not necessarily be disposed in the coupling area PA. In some cases, the pads connected to the plurality of wirings may be disposed around both short sides of the display area DA or around both short sides and both long sides of the display area DA.

The first circuit board 300 may be attached onto the pads provided at an edge of the coupling area PA, which is a side of the display panel 100, by using an anisotropic conductive film. Lead lines of the first circuit board 300 may be electrically connected to the pads provided at the edge of the coupling area PA. The first circuit board 300 may be a flexible printed circuit board, a printed circuit board, or a flexible film such as a chip on film.

The first circuit board 300 includes a plurality of stacked structures. The first circuit board 300 may include a plurality of wiring layers, an insulating layer disposed between the wiring layers, and an organic protective layer disposed on and under the wiring layers.

Figure 2:
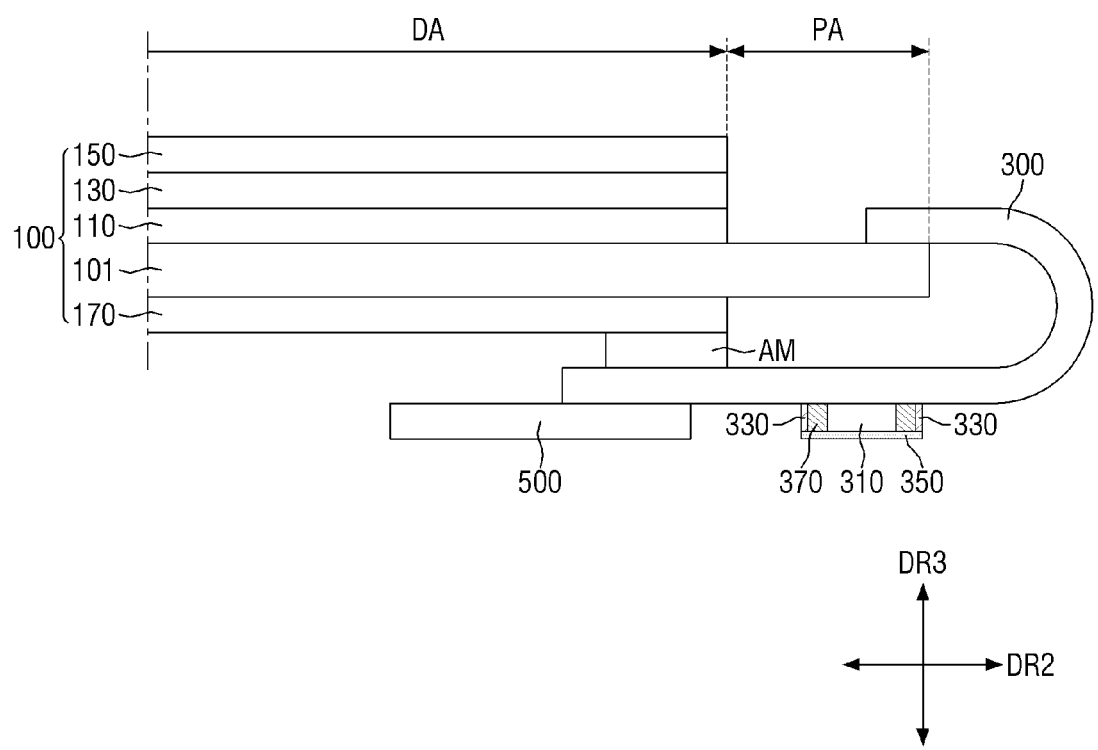
FIG. 2 is a partial cross-sectional view of the display device of FIG. 1.

The first circuit board 300 may be bent toward a lower surface of the display panel 100 as shown in FIG. 2. In this case, a first side of the first circuit board 300 may be attached to the coupling area PA at an edge of the display panel 100, and a second side of the first circuit board 300 may be disposed under the display panel 100 and connected to a system board on which a host system is mounted. For example, the second side of the first circuit board 300 may be a side opposite to the first side of the first circuit board 300. A driver integrated circuit 310 is disposed on the first circuit board 300. The driver integrated circuit 310 may be connected to the wiring layers and may be electrically connected to pads of the display panel 100 and circuit pads of the second circuit board 500.

In addition, as illustrated in the drawing (e.g., FIG. 2), the display device 10 according to the exemplary embodiment may include an insulating tape 350 disposed on the driver integrated circuit 310. The insulating tape 350 may be disposed on the first circuit board 300 to cover the driver integrated circuit 310 and prevent generation of static electricity in the driver integrated circuit 310. The structure of the driver integrated circuit 310 and the insulating tape 350 on the first circuit board 300 will be described in more detail later with reference to other drawings.

The second circuit board 500 may include a circuit pad area attached onto the second side of the first circuit board 300. A plurality of circuit pads may be disposed in the circuit pad area of the second circuit board 500 and may be connected to the lead lines of the first circuit board 300. Although the second circuit board 500 is attached only to the second side of the first circuit board 300 located below the driver integrated circuit 310 in the drawing (e.g., FIG. 2), the invention is not limited to this example. In some cases, the second circuit board 500 may also be attached onto a left or a right side of the first circuit board 300 to partially cover the driver integrated circuit 310. Here, the left and right sides of the first circuit board 300 are the sides of the first circuit board 300 other than the first and second sides of the first circuit board 300.

FIG. 2 is a partial cross-sectional view of the display device 10 of FIG. 1.

Referring to FIG. 2, the display panel 100 may include a base substrate 101, a circuit driving layer 110, a light emitting layer 130, an encapsulating layer 150, and an under-panel member 170. The first circuit board 300 may be disposed on a side of the base substrate 101 and may be bent in a downward direction (i.e., a third direction DR3) to be attached to a lower surface of the under-panel member 170 by an adhesive member AM.

The circuit driving layer 110 may include display wirings, display electrodes, and at least one transistor and may control the amount of light emitted from the light emitting layer 130. The light emitting layer 130 may include a material that emits light of a specific wavelength band, for example, an organic light emitting material.

The base substrate 101 may be a flexible substrate including a flexible polymer material such as polyimide. Accordingly, the display panel 100 can be curved, bent, folded, or rolled. In some exemplary embodiments, the base substrate 101 may include a plurality of sub-substrates overlapping each other in a thickness direction (i.e., the third direction DR3) with a barrier layer interposed between them. In this case, each of the sub-substrates may be a flexible substrate.

The circuit driving layer 110 may be disposed on the base substrate 101. The circuit driving layer 110 may include a circuit for driving the light emitting layer 130 of each pixel. The circuit driving layer 110 may include a plurality of thin-film transistors.

The light emitting layer 130 may be disposed on the circuit driving layer 110. The light emitting layer 130 may include an organic light emitting layer. The light emitting layer 130 may emit light at various luminance levels according to a driving signal transmitted from the circuit driving layer 110.

The encapsulating layer 150 may be disposed on the light emitting layer 130. The encapsulating layer 150 may include an inorganic layer or a stack of an inorganic layer and an organic layer.

Although not illustrated in the drawing, a touch layer may be disposed on the encapsulating layer 150. The touch layer is a layer for recognizing a touch input and may perform the function of a touch member. The touch layer may include a plurality of sensing areas and sensing electrodes.

The under-panel member 170 is disposed on the lower surface of the base substrate 101. The under-panel member 170 may include at least one functional layer and an insulating layer. In an exemplary embodiment, the functional layer may be a layer performing a heat dissipating function, an electromagnetic wave shielding function, a grounding function, a buffering function, a strength enhancing function, a support function, or a digitizing function, for example. The functional layer may be composed of a single layer, but may also be composed of a plurality of stacked thin films or coating layers. The functional layer may be, for example, a support member, a heat dissipating layer, an electromagnetic wave shielding layer, a shock absorbing layer, or a digitizer, for example.

The first circuit board 300 may be bent toward the lower surface of the display panel 100 as illustrated in FIG. 2. The first circuit board 300 and the second circuit board 500 may be located under the under-panel member 170 of the display panel 100 and may be attached to the display panel 100 by the adhesive member AM. The adhesive member AM may be disposed at a position recessed inward from the second side of the first circuit board 300 as shown in FIG. 2. Here, the second side of the first circuit board 300 is the side to which the second circuit board 500 is attached. In other words, as illustrated in FIG. 2, the second side of the first circuit board 300 may protrude from the adhesive member AM and face the lower surface of the display panel 100. This structure can prevent internal foreign matter from being attached to the adhesive member AM or the resultant defect, which may occur when a lower surface of the adhesive member AM is exposed outside from the first circuit board 300. In addition, the adhesive member AM can be prevented from flowing down from the second side of the first circuit board 300.

The second circuit board 500 is attached onto the second side of the first circuit board 300 as described above. An area where the second circuit board 500 is attached to the first circuit board 300 may overlap an area where the adhesive member AM is located at least partially in the plan view. The second circuit board 500 may be spaced apart from the lower surface of the display panel 100 (i.e., the lower surface of the under-panel member 170) and may face the lower surface of the display panel 100.

The driver integrated circuit 310 is disposed on the first circuit board 300. The driver integrated circuit 310 may be spaced apart from the second circuit board 500 and may be positioned under the display panel 100 in the case that the first circuit board 300 is bent toward the lower surface of the display panel 100. As described above, the display device 10 may include the insulating tape 350 disposed on the first circuit board 300 to cover the driver integrated circuit 310. A part of the insulating tape 350 may protrude outward from side surfaces of the driver integrated circuit 310 to protect the driver integrated circuit 310 as shown in FIG. 2. That is, the area of the insulating tape 350 is greater than the area of the driver integrated circuit 310 in the plan view. In another exemplary embodiment, the protruding part may be directly attached to an upper surface of the first circuit board 300.

Here, which surface of the first circuit board 300 or the insulating tape 350 is an upper surface or a lower surface is determined based on the state before the first circuit board 300 is curved. In this case, however, a space to which the insulating tape 350 may be attached may not be secured due to the second circuit board 500 attached onto the first circuit board 300. Therefore, the first circuit board 300 and the insulating tape 350 may not be firmly attached to each other. The display device 10 according to an exemplary embodiment may include a sealing member 330 which surrounds the driver integrated circuit 310, and at least a part of a lower surface of the insulating tape 350 may contact the sealing member 330. Accordingly, since the lower surface of the insulating tape 350 is attached to the sealing member 330, a lifting phenomenon of the insulating tape 350 (to be described later) can be prevented, and the driver integrated circuit 310 can be reliably protected.

Members disposed on the first circuit board 300 will now be described in detail with reference to other drawings.

Figure 4:
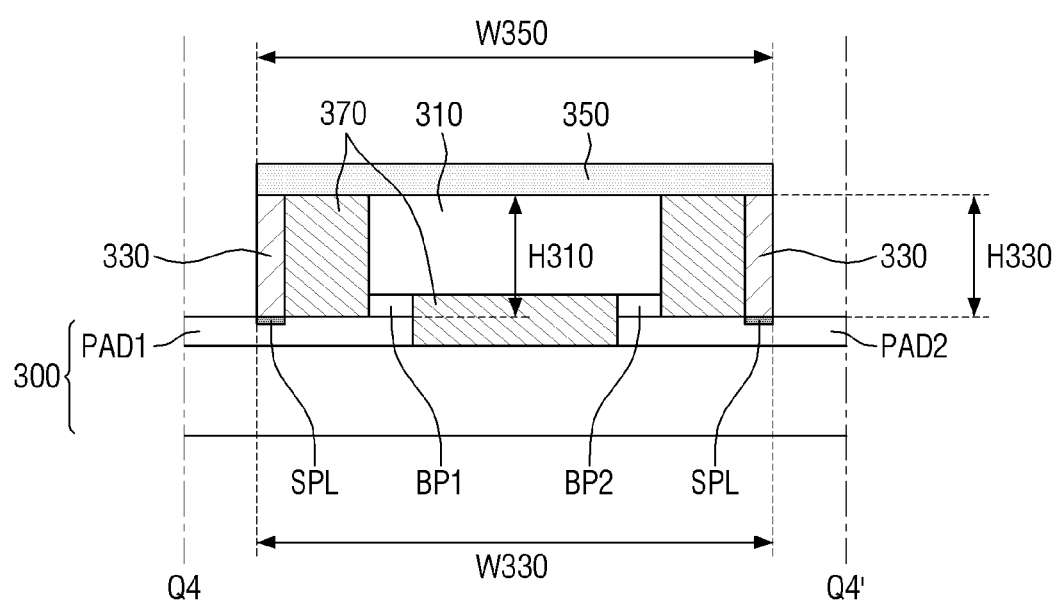
FIG. 4 is a cross-sectional view taken along line Q4-Q4' of FIG. 3.

FIG. 3 is a plan view of the first circuit board 300 according to an exemplary embodiment. FIG. 4 is a cross-sectional view taken along line Q4-Q4' of FIG. 3. FIG. 4 is a cross-section taken along a second direction DR2 across the driver integrated circuit 310 of the first circuit board 300 according to the exemplary embodiment.

Referring to FIGS. 3 and 4, the display device 10 according to the exemplary embodiment may include the display panel 100, the first circuit board 300 which is attached to a side of the display panel 100, and the driver integrated circuit 310, a print layer SPL, the sealing member 330, the insulating tape 350 and a protective resin 370 which are disposed on the first circuit board 300.

The first circuit board 300 may include a first area CA1, a second area CA2, and a third area CA3. The first area CA1 is the first end of the first circuit board 300 and may be an area where the first circuit board 300 is attached to the coupling area PA of the display panel 100. A lower surface of the first area CA1 of the first circuit board 300 is attached to the coupling area PA of the display panel 100. The third area CA3 is the second end opposite the first area CA1 and may be an area to which the second circuit board 500 is attached. An upper surface of the third area CA3 of the first circuit board 300 may be attached to a side of the second circuit board 500. The second circuit board 500 is spaced apart from the sealing member 330 (to be described later). However, the invention is not limited to this example. In another exemplary embodiment, the second circuit board 500 may also be attached to the first circuit board 300 in an area other than the third area CA3.

The second area CA2 is located between the first area CA1 and the third area CA3 and may be an area where members disposed on the first circuit board 300 are located. Since the first circuit board 300 is disposed on the display panel 100 in the first area CA1 and attached to the second circuit board 500 in the third area CA3, members such as the driver integrated circuit 310 and the insulating tape 350 may be disposed in the second area CA2.

In addition, the first circuit board 300 may include a plurality of wiring layers and pads as described above. The wirings and pads of the first circuit board 300 may be connected to the wirings or pads of the display panel 100 in the first area CA1 and the second circuit board 500 in the third area CA3, respectively. The wirings and pads of the first circuit hoard 300 may partially extend to the second area. CA2.

The driver integrated circuit 310 may be disposed on the second area CA2 of the first circuit board 300. The driver integrated circuit 310 may be an integrated circuit into which a data driver integrated circuit for transmitting a data signal and a scan driver integrated circuit for transmitting a scan signal are integrated. The driver integrated circuit 310 may be, but is not limited to, a chip on film ("COF") implemented as a driver chip. The driver integrated circuit 310 may be coupled to wirings included in the first circuit board 300 (i.e., a first wiring PAD1 and a second wiring PAD2) by conductive coupling members BP1 and BP2. In particular, the driver integrated circuit 310 may be connected to the first wiring PAD1 by a first conductive coupling member BP1 and may be connected to the second wiring PAD2 by a second conductive coupling member BP2. The first wiring PAD1 may be connected to other pads of the first circuit board 300 connected to the pads of the coupling area PA of the display panel 100 in the first area CA1, and the second wiring PAD2 may be connected to other pads of first circuit board 300 connected to the pads of the second circuit board 500 in the third area CA3. However, the invention is not limited to this case.

The print layer SPL may be formed on the first circuit board 300. The print layer SPL according to an exemplary embodiment may be spaced apart from the driver integrated circuit 310 in the second area CA2. In FIGS. 3 and 4, the print layer SPL surrounds an outer surface of the driver integrated circuit 310. However, the invention is not limited to this case. In another exemplary embodiment, the print layer SPL may also include a plurality of print patterns spaced apart from each other to face a part of the outer surface of the driver integrated circuit 310. Here, the outer surface of the driver integrated circuit 310 is a side surface of the driver integrated circuit 310 as shown in FIG. 2.

The first circuit board 300 having the print layer SPL may be prepared before the display panel 100 is attached to the first circuit board 300. The print layer SPL may be a layer for marking an area where the sealing member 330 (to be described later) is disposed. The sealing member 330 is disposed in the second area CA2. The sealing member 330 may surround the outer surface of the driver integrated circuit 310, and at least a part of the sealing member 330 may cover the print layer SPL. The sealing member 330 may be disposed to have a predetermined height from the upper surface of the first circuit board 300. The sealing, member 330 may be spaced apart from the outer surface of the driver integrated circuit 310 to face the outer surface of the driver integrated circuit 310 and may be disposed in the second area CA2 not to contact the second circuit board 500.

In an exemplary embodiment, a height H330 of the sealing member 330 may be equal to or greater than a height H310 measured from the upper surface of the first circuit board 300 to an upper surface of the driver integrated circuit 310. The sealing member 330 may be provided to surround the driver integrated circuit 310 and may form a predetermined space in which the driver integrated circuit 310 is disposed. The protective resin 370 (to be described later) may be disposed in the predetermined space and protect the driver integrated circuit 310. The sealing member 330 may be disposed along the print layer SPL on the first circuit board 300 in a fabrication process of the display device 10.

The insulating tape 350 may be disposed on the sealing member 330 and the driver integrated circuit 310, The insulating tape 350 may prevent static electricity from being generated in the driver integrated circuit 310. The insulating tape 350 may cover the driver integrated circuit 310 and may be attached to an upper surface of the sealing member 330. The insulating tape 350 may overlap the driver integrated circuit 310, and both sides of the insulating tape 350 may be partially attached to the upper surface of the sealing member 330 to surround the driver integrated circuit 310 together with the sealing member 330 as shown in FIG. 4. Accordingly, the driver integrated circuit 310 may not be exposed to outside air and may be prevented from having static electricity.

In an exemplary embodiment, a side surface of the insulating tape 350 may form a level surface with a side surface of the sealing member 330 or form the same surface perpendicular to the first circuit board 300 with the side surface of the sealing member 330 as illustrated in the drawings (e.g., FIG. 4). That is, a width W350 of the insulating tape 350 measured in a direction (i.e., the first direction DR1 or the second direction DR2) may be equal to a distance W330 between two opposite outer surfaces of the sealing member 330 measured in the same direction. Accordingly, a side surface of the insulating tape 350 may be aligned with a side surface of the sealing member 330 in a vertical direction (i.e., the third direction DR3). The insulating tape 350 may not protrude from a side surface of the sealing member 330 to the outside because the width W350 of the insulating tape 350 is equal to or smaller than the distance W330 of the sealing member 330. The insulating tape 350 may be disposed on the first circuit board 300 such that its lower surface having adhesiveness is not exposed outside. Therefore, internal foreign matter can be prevented from adhering to the insulating tape 350.

In addition, according to an exemplary embodiment, the height H330 of the sealing member 330 may be equal to or greater than the height H310 measured from the upper surface of the first circuit board 300 to the upper surface of the driver integrated circuit 310. The insulating tape 350 may prevent static electricity that can be generated in the driver integrated circuit 310 if the insulating tape 350 does not exist and, at the same time, form an enclosed space with the sealing member 330 so that the driver integrated circuit 310 can be protected by the protective resin 370. If the sealing member 330 is formed to have a lower height than the driver integrated circuit 310, the insulating tape 350 may be attached to the upper surface of the driver integrated circuit 310 and may not be firmly attached to the upper surface of the sealing member 330. In this case, a step may be formed in an area where the insulating tape 350 is attached to the sealing member 330. Due to the step, the insulating tape 350 may peel off, causing the protective resin 370 to leak out or the driver integrated circuit 310 to be exposed to outside air. This the lifting phenomenon of the insulating tape 350.

To prevent this, in the display device 10 according to an exemplary embodiment, the height H330 of the sealing member 330 may be equal to the height H310 from the upper surface of the driver integrated circuit 310 to the upper surface of the first circuit board 300. The insulating tape 350 may be attached to each of the upper surface of the driver integrated circuit 310 and the upper surface of the sealing member 330 to form an enclosed space with the sealing member 330. This can prevent the protective resin 370 from leaking out, prevent the driver integrated circuit 310 from being exposed to outside air, and prevent static electricity that can be generated in the driver integrated circuit 310.

Although the insulating tape 350 is entirely attached to the upper surface of the driver integrated circuit 310 and the upper surface of the sealing member 330 in the drawings, the invention is not limited to this case. In some cases, the insulating tape 350 may be spaced apart from the upper surface of the driver integrated circuit 310 or may be recessed inward from a side surface of the sealing member 330, This will be described in detail with reference to other exemplary embodiments.

The protective resin 370 may surround the driver integrated circuit 310 in order to protect the driver integrated circuit 310. In an exemplary embodiment, the protective resin 370 may be disposed between the insulating tape 350 and the first circuit board 300 in an area surrounded by the sealing member 330. That is, the protective resin 370 may surround the side and lower surfaces of the driver integrated circuit 310 in the space formed by the insulating tape 350 and the sealing member 330. The space formed by the sealing member 330 and the insulating tape 350 may be sealed so that the driver integrated circuit 310 is not exposed to outside air, and the sealed space may be filled with the protective resin 370.

Since the first circuit board 300 is attached to the second circuit board 500 in the third area CA3, the members disposed on the first circuit board 300 may be located in the second area CA2. In order to prevent the static electricity, the insulating tape 350 needs to completely surround the driver circuit board 310 and prevent the driver integrated circuit 310 from being exposed to outside air. However, in a certain case, the second area CA2 may not provide a sufficient space for the insulating tape 350 to be disposed to cover the driver integrated circuit 310. In particular, when the insulating tape 350 is directly disposed on the driver integrated circuit 310, it may not completely cover the side surfaces of the driver integrated circuit 310 due to a step formed by the driver integrated circuit 310. The display device 10 according to the exemplary embodiment above may include the sealing member 330 disposed on the first circuit board 300 in order to prevent the driver integrated circuit 310 from being exposed to outside air, and the insulating tape 350 may be attached onto the sealing member 330 as well as the driver integrated circuit 310. Therefore, the sealing member 330 may compensate for the step formed by the driver integrated circuit 310, and the insulating tape 350 may be attached to the sealing member 330 without the lifting phenomenon and without directly contacting the first circuit board 300.

In addition, since the insulating tape 350 is attached to the upper surface of the sealing member 330, an area where the insulating tape 350 is not disposed can be further secured on the first circuit board 300. In the display device 10 according to an exemplary embodiment, the sealing member 330 may be provided in a narrow space on the first circuit board 300 to provide an area where the insulating tape 350 for protecting the driver integrated circuit 310 is disposed and to secure a space, in which the second circuit board 500 is disposed, on the first circuit board 300.

The display device 10 according to an exemplary embodiment may protect the driver integrated circuit 310 from being exposed to outside air by including the print layer SPL, the sealing member 330 disposed to partially overlap the print layer SPL, and the insulating tape 350 disposed on the sealing member 330. The display device 10 may be fabricated by preparing the first circuit hoard 300 having the print layer SPL and forming the sealing member 330 by injecting a sealant 330' (see FIG. 11) along the print layer SPL. A method of fabricating the display device 10 according to an exemplary embodiment will now be described.

Figure 5:
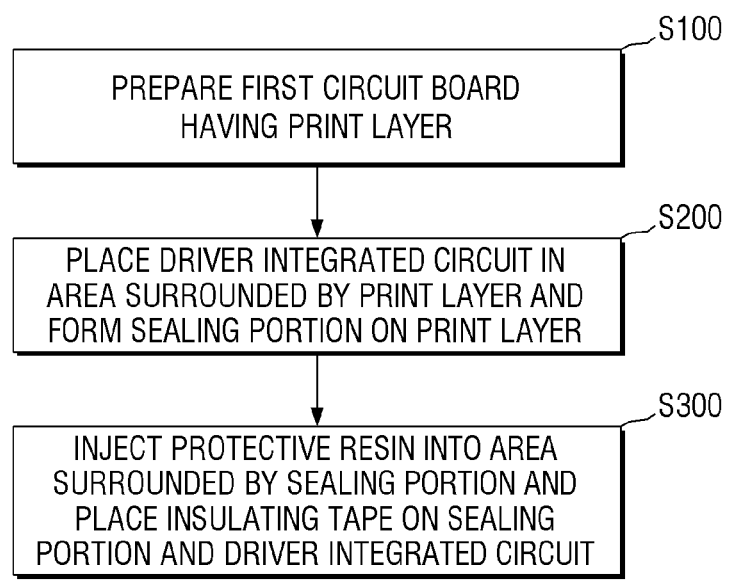
FIG. 5 is a flowchart illustrating a method of fabricating a display device according to an exemplary embodiment.

FIG. 5 is a flowchart illustrating a method of fabricating a display device according to an exemplary embodiment.

Referring to FIG. 5, the method of fabricating the display device 10 according to the exemplary embodiment may include preparing the first circuit board 300 having the print layer SPL (operation S100), placing the driver integrated circuit 310 in an area surrounded by the print layer SPL and forming the sealing member 330 on the print layer SPL (operation S200), and injecting the protective resin 370 into an area surrounded by the sealing member 330 and placing the insulating tape 350 on the sealing member 330 and the driver integrated circuit 310 (operation S300).

In the fabrication process of the display device 10, the sealing member 330 placed around the driver integrated circuit 310 to protect the driver integrated circuit 310 may be formed by injecting the sealant 330' (see FIG. 11) along the print layer SPL formed on the first circuit board 300. In the injecting of the sealant 330', a camera CM (see FIG. 11) which senses the print layer SPL formed on the first circuit board 300 may move along the prim layer SPL, and the sealant 330' may be injected from a first nozzle NZ1 moving in the same direction as the camera CM. The process of fabricating the display device 10 will now be described in detail with reference to other drawings.

FIGS. 6 through 13 are schematic views illustrating a process of fabricating a display device according to an exemplary embodiment.

Figure 6:
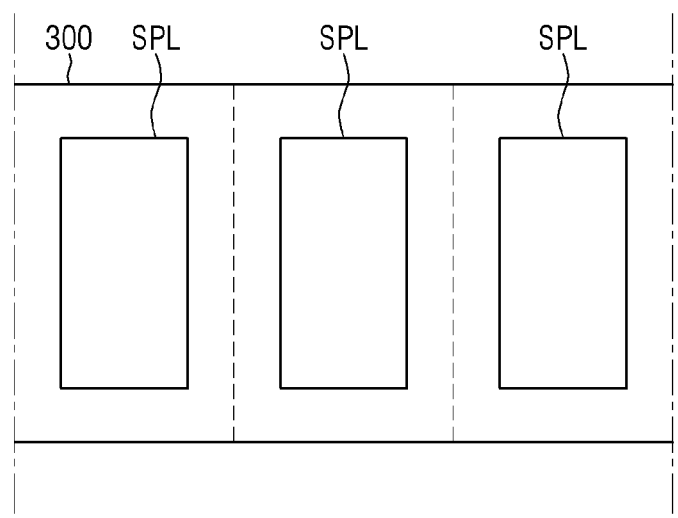
FIGS. 6 through 13 are schematic views illustrating a process of fabricating a display device according to an exemplary embodiment.

First, referring to FIG. 6, a first circuit board 300 having a print layer SPL is prepared (operation S100). Although not illustrated in the drawing, the first circuit board 300 includes a first area CA1, a second area CA2, and a third area CA3. The print layer SPL may be formed in the second area CA2, The print layer SPL may surround an area where a driver integrated circuit 310 is to be disposed. In the drawing, the print layer SPL completely surrounds an area. The driver integrated circuit 310 may be disposed in the area surrounded by the print layer SPL. However, the invention is not limited to this example. In another exemplary embodiment, the print layer SPL may include one or more patterns, and the patterns may be spaced apart from each other to surround an area. This will be described with reference to other exemplary embodiments.

Figure 7:
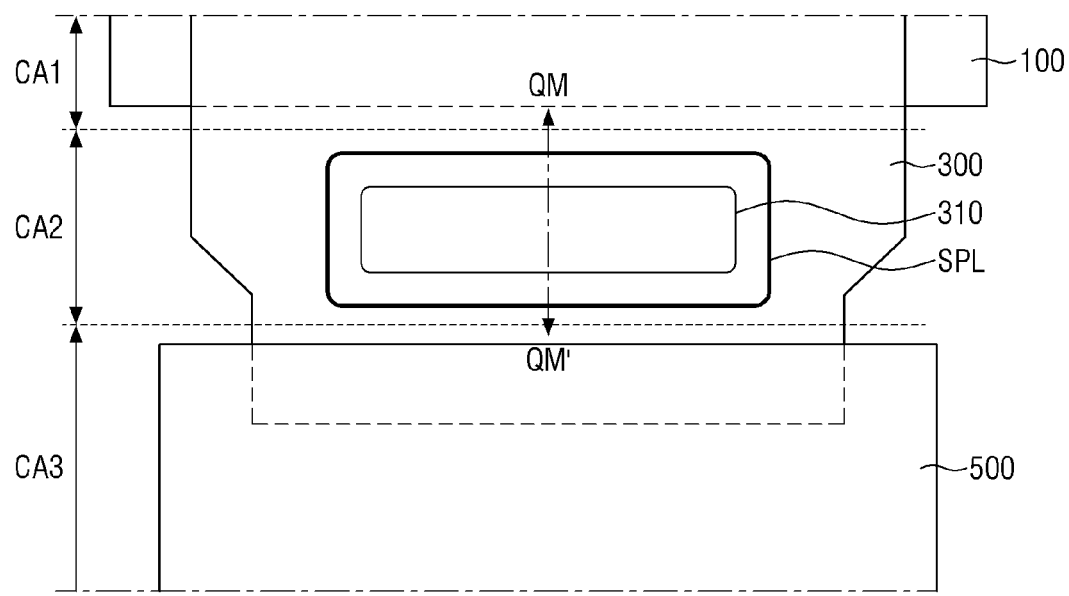
Figure 8:
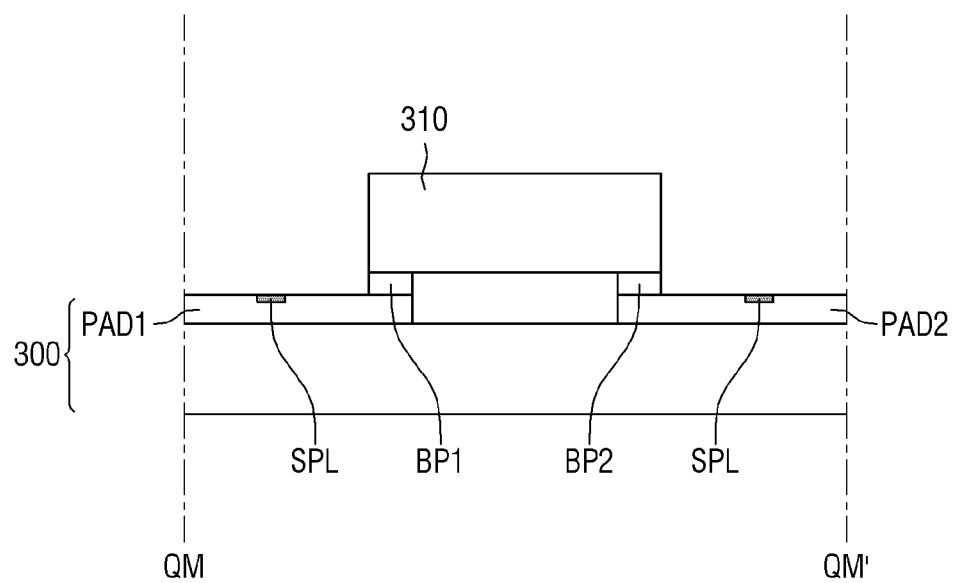

Next, referring to FIGS. 7 and 8, the first circuit board 300 having the print layer SPL is attached to a display panel 100 and a second circuit board 500, and the driver integrated circuit 310 is placed on the first circuit board 300. FIG. 8 is a cross-sectional view taken along line QM-QM' of FIG. 7, and the line QM-QM' is a cross-section taken across the print layer SPL formed on the first circuit board 300. As described above, the first circuit board 300 may be attached to the display panel 100 in the First area CA1 and may be attached to the second circuit board 500 in the third area. CA3. The second circuit board 500 may be attached to the third area CA3 such that the second circuit board 500 is spaced apart from the print layer SPL.

The driver integrated circuit 310 may be placed on the second area. CA2 of the first circuit board 300. The driver integrated circuit 310 is placed in the area surrounded by the print layer SPL and is spaced apart from the print layer SPL. Accordingly, an outer surface of the driver integrated circuit 310 may face at least a part of the print layer SPL.

Figure 9:
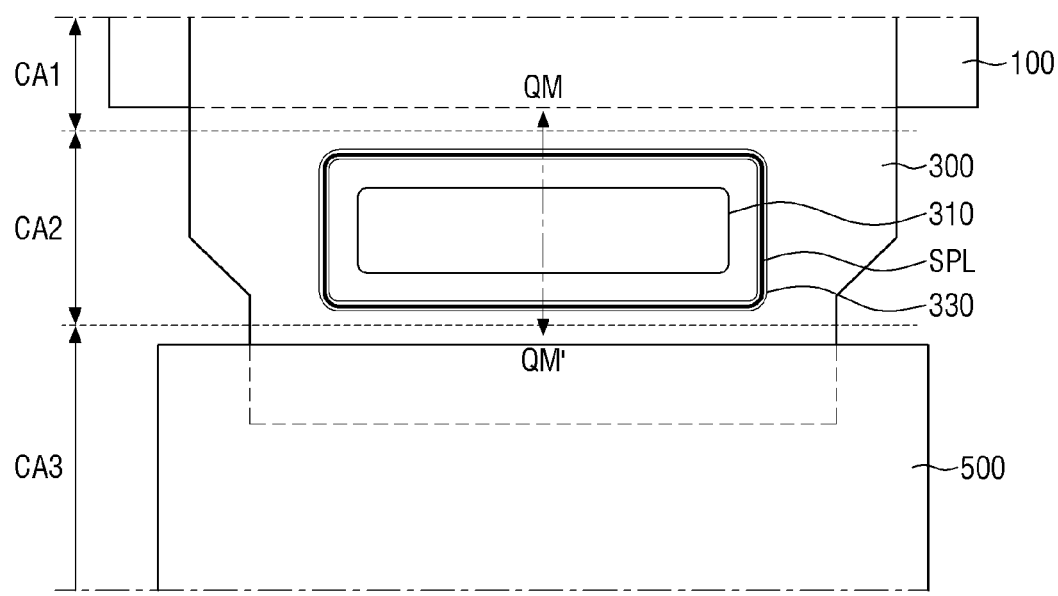
Figure 10:
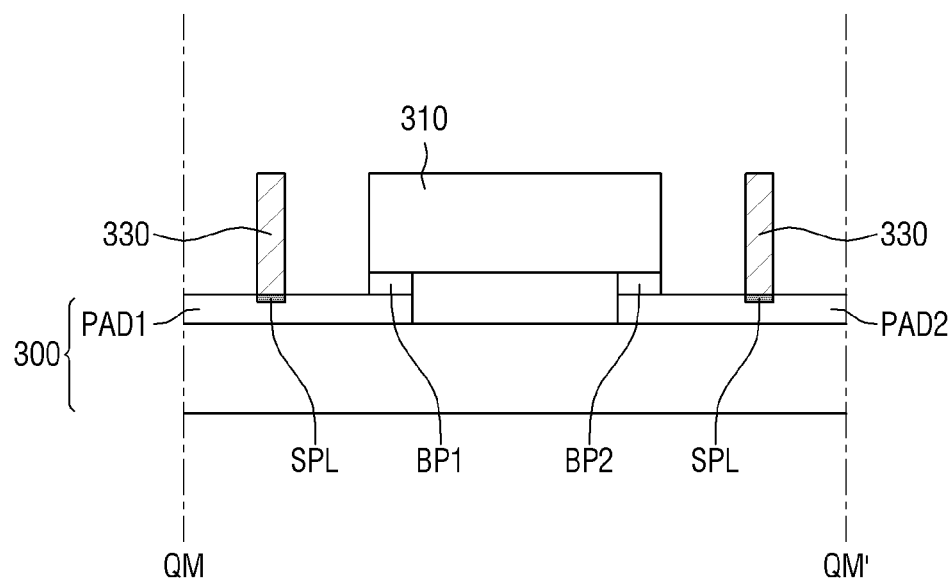

Next, referring to FIGS. 9 and 10, a sealing member 330 is formed on the print layer SPL. At least a part of the sealing member 330 may overlap the print layer SPL, and the sealing member 330 may be spaced apart from the driver integrated circuit 310. Since the print layer SPL is formed to completely surround the outer surface of the driver integrated circuit 310, the sealing member 330 is formed directly on the print layer SPL in the drawings. However, the invention is not limited to this case. In another exemplary embodiment that the print layer SPL includes patterns spaced apart from each other, the sealing member 330 may include an area overlapping the print layer SPL and an area not overlapping the print layer SPL.

The sealing member 330 is placed to surround the area surrounded by the print layer SPL (i.e., the area where the driver integrated circuit 310 is disposed). The sealing member 330 may be spaced apart from the outer surface of the driver integrated circuit 310 to face the outer surface of the driver integrated circuit 310 and may completely surround the area where the driver integrated circuit 310 is disposed. The sealing member 330 may be formed by injecting a sealant 330' along the print layer SPL formed on the first circuit board 300.

Figure 11:
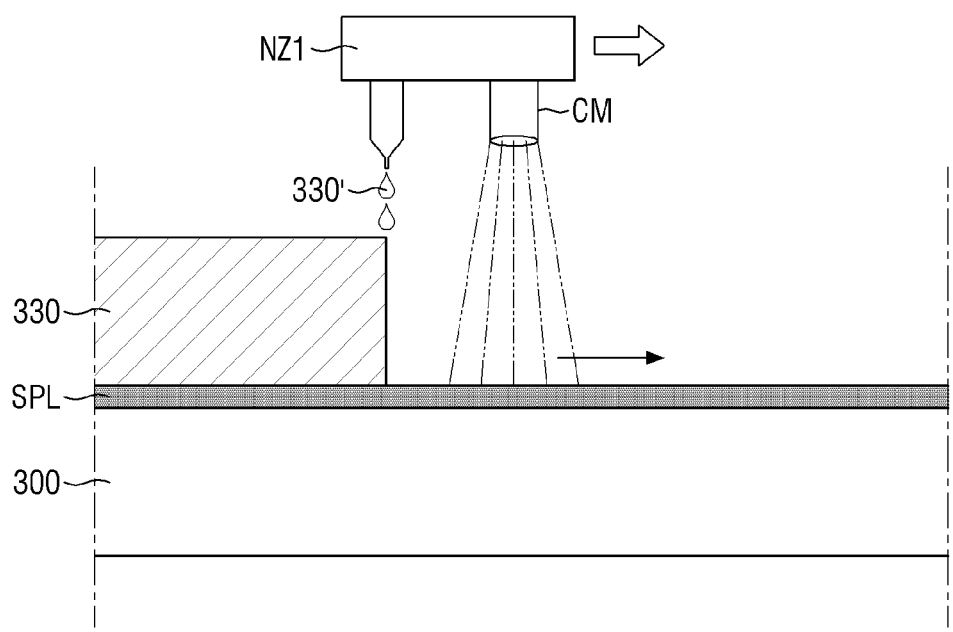

Referring to FIG. 11, in the method of fabricating a display device 10 according to an exemplary embodiment, the forming of the sealing member 330 may include moving a camera CM, which senses the position of the print layer SPL formed on the first circuit board 300, along the print layer SPL and injecting the sealant 330' onto the print layer SPL using a first nozzle NZ1 moving in the same direction as the camera CM. The camera CM may sense the print layer SPL formed on the first circuit board 300. The camera CM may move along the print layer SPL, and the first nozzle NZ1 may move in the same direction as the direction in which the camera CM moves. As illustrated in the drawings, the camera CM and the first nozzle NZ1 may be disposed in the same device and may move integrally with each other. However, the invention is not limited to this example.

The first nozzle NZ1 may inject the sealant 330' onto the print layer SPL when the camera. CM moves along the print layer SPL. The first nozzle NZ1 moves at a distance from the camera CM and injects the sealant 330' onto the print layer SPL. The sealant 330' may be injected to a predetermined height on the print layer SPL, thereby forming the sealing member 330. Since the sealing member 330 is disposed on the first circuit board 300 along the print layer SPL, it surrounds the area where the driver integrated circuit 310 is disposed.

Figure 12:
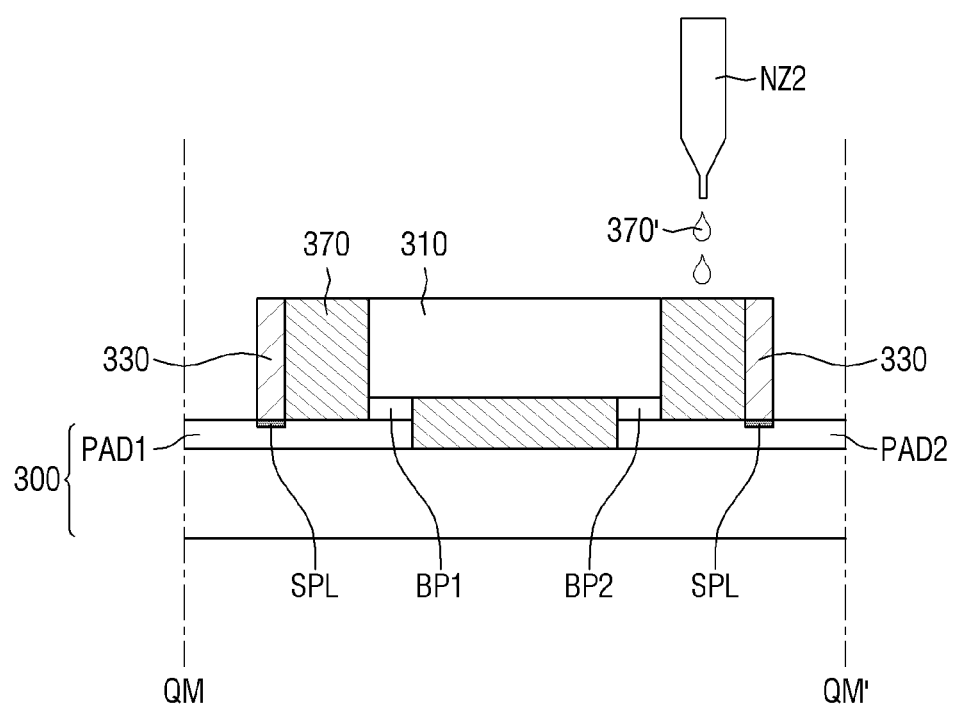

Next, referring to FIG. 12, a protective resin 370 is injected into an area surrounded by the sealing member 330. The protective resin 370 may be injected into the area using a second nozzle NZ2. The protective resin 370 may be injected to surround the driver integrated circuit 310 and may also be disposed between a lower surface of the driver integrated circuit 310 and the upper surface of the first circuit board 300.

Figure 13:
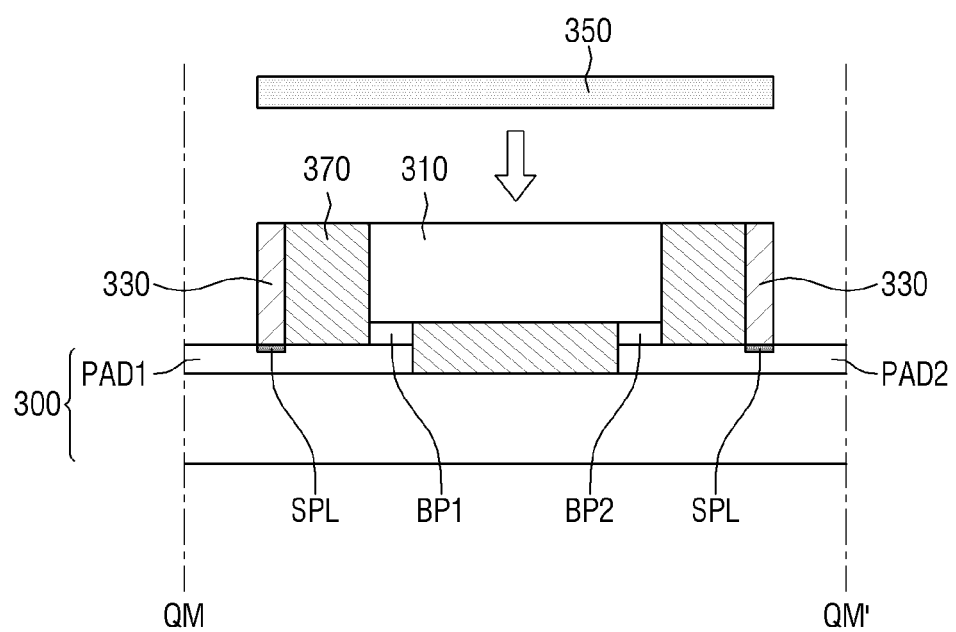

Finally, referring to FIG. 13, an insulating tape 350 is placed on the driver integrated circuit 310 and the sealing member 330 (operation S300). The insulating tape 350 may be disposed on at least a part of an upper surface of the sealing member 330 as described above. The insulating tape 350 may seal the area defined by the sealing member 330 disposed to surround the driver integrated circuit 310 and may prevent the static electricity that can be generated in the driver integrated circuit 310.

Through the above-described process, the display device 10 in which the sealing member 330 and the insulating tape 350 surround the driver integrated circuit 310 may be fabricated. In the display device 10 according to the exemplary embodiment, the sealing member 330 may be disposed to surround the driver integrated circuit 310, and the insulating tape 350 may be disposed to prevent the driver integrated circuit 310 from being exposed to outside air. Due to the insulating tape 350 attached to the upper surface of the sealing member 330, a space in which the second circuit board 500 can be attached to the third area CA3 of the first circuit board 300 may be secured.

Hereinafter, display devices according to other exemplary embodiments will now be described with reference to other drawings.

Figure 14:
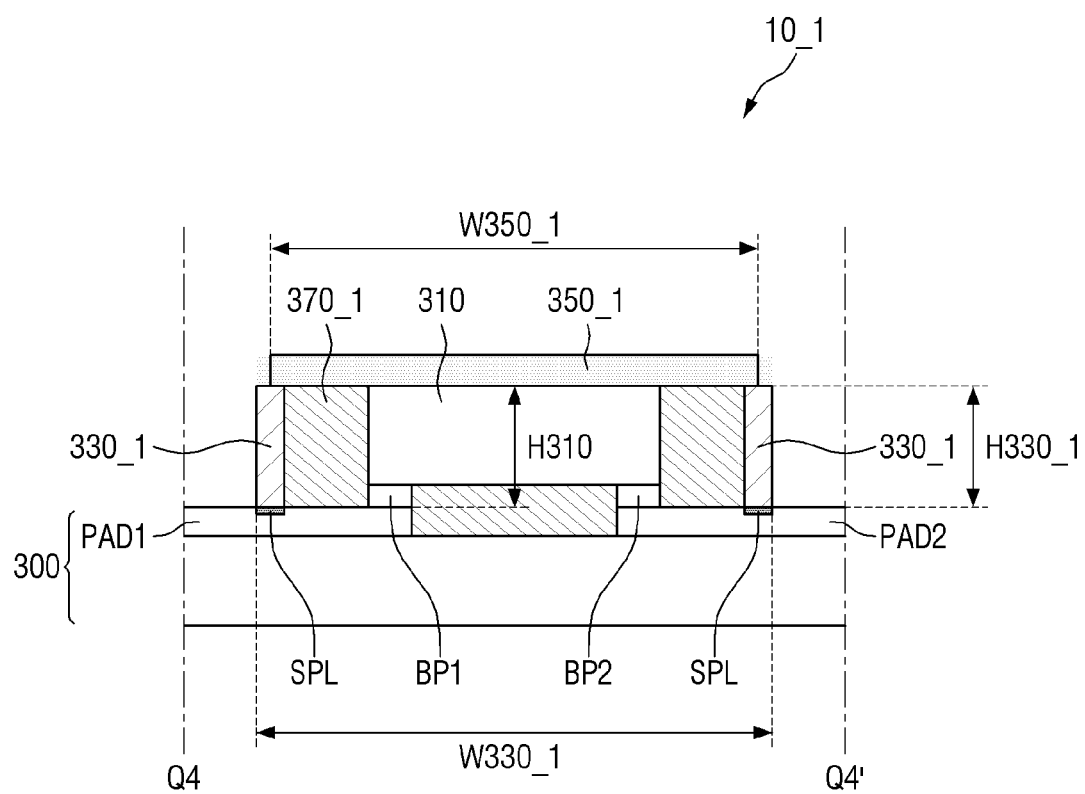
FIGS. 14 through 16 are partial cross-sectional views of first circuit boards of display devices according to exemplary embodiments.
Figure 15:
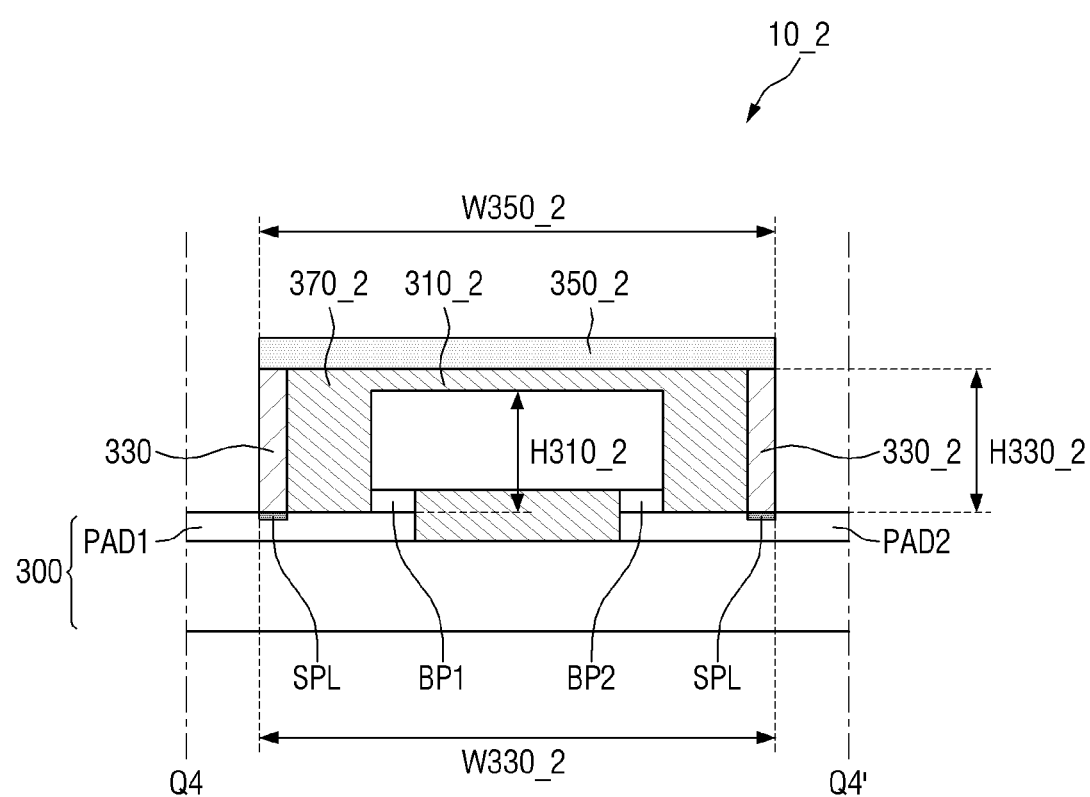
Figure 16:
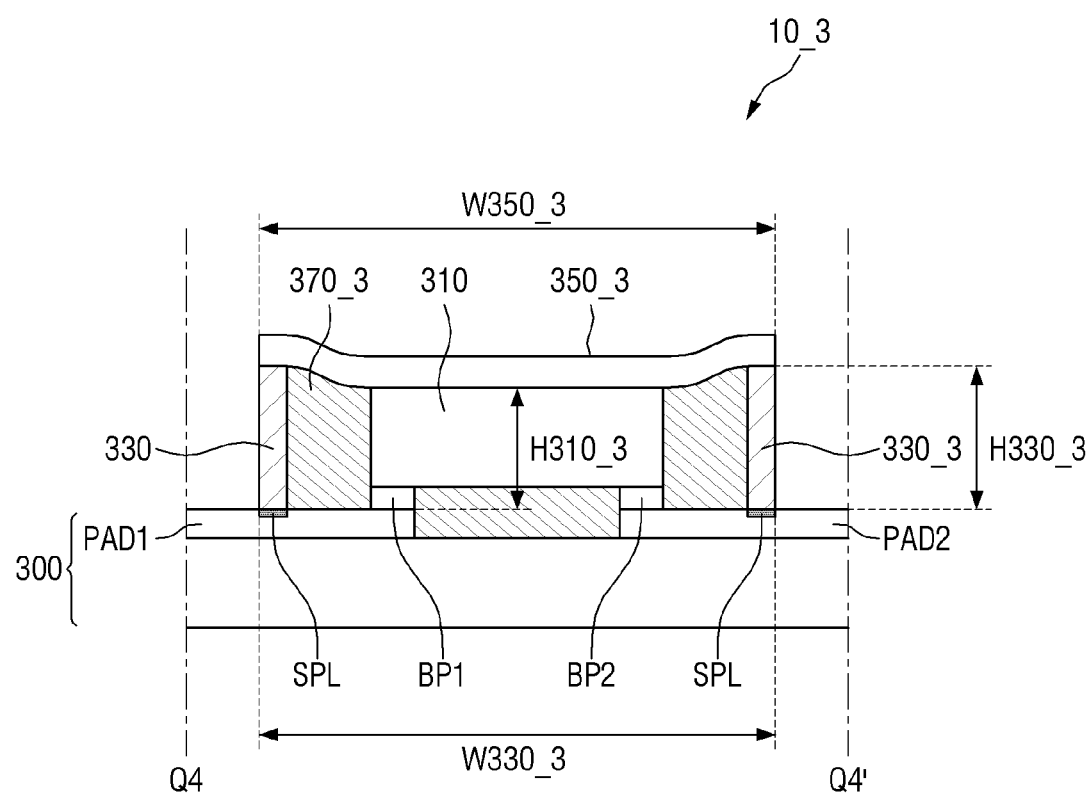

FIGS. 14 through 16 are partial cross-sectional views of various first circuit boards of display devices according to exemplary embodiments.

As described above, the insulating tape 350 of the display device 10 may not necessarily be attached to the entire upper surface of the sealing member 330 and may also be spaced apart from the upper surface of the driver integrated circuit 310.

First, referring to FIG. 14, in a display device 10_1 according to an exemplary embodiment, a width W350_1 of an insulating tape 350_1 in a direction may be smaller than a distance W330_1 between two opposite outer surfaces of a sealing member 330_1 measured in the same direction (i.e., the first direction DR1 or the second direction DR2), The display device 10_1 of FIG. 14 is the same as the display device 10 of FIG. 4 except for the width W350_1 of the insulating tape 350_1. Hereinafter, any redundant description will be omitted, and differences will be described.

As illustrated in FIG. 14, according to the exemplar embodiment, the insulating tape 350_1 has a width smaller than the distance W330_1 of the sealing member 330 measured in the same direction. Therefore, the insulating tape 350_1 may be attached to only a part of an upper surface of the sealing member 330_1. The other part of the upper surface of the sealing member 330_1 is exposed outside. Since the upper surface of the sealing member 330_1 does not have adhesiveness, it may not be contaminated by internal foreign matter even if it is exposed outside, A side surface of the insulating tape 350_1 may be recessed inward from a side surface of the sealing member 330_1.

In a fabrication process of the display device 10_1, a process of forming the sealing member 330_1 includes injecting a sealant 330' of the sealing member 330_1 along a print layer SPL. The thickness of the sealing member 330_1 (in the first direction DR1 or the second direction DR3) may not be uniform depending on the amount of the sealant 330' injected or the injection time. However, since a second area CA2 on a first circuit board 300 may provide only a narrow space, the insulating tape 350_1 having a uniform size may be attached to the upper surface of the sealing member 330_1. In some cases, even if the thickness or distance W330_1 of the sealing member 330_1 is increased, an outer end of the insulating tape 350_1 may be partially attached to the upper surface of the sealing member 330_1. Accordingly, the insulating tape 350_1 may form an enclosed space with the sealing member 330_1, and a protective resin 370_1 disposed in the space may protect a driver integrated circuit 310.

In some cases, the height of the sealing member 330 (in the third direction DR3) may be greater than that of the driver integrated circuit 310. Referring to FIG. 15, in a display device 10_2 according to an exemplary embodiment, a height H330_2 of a sealing member 330_2 may be greater than a height H310_2 measured from an upper surface of a driver integrated circuit 310_2 to an upper surface of a first circuit board 300. The display device 102 of FIG. 15 is the same as the display device 10 of FIG. 4 except that the height H330_2 of the sealing member 330_2 is greater than the height H310_2 of the driver integrated circuit 310_2. Hereinafter, any redundant description will be omitted, and differences will be described.

As illustrated in FIG. 15, an upper surface of the sealing member 330_2 may protrude above the upper surface of the driver integrated circuit 310_2. A lower surface of an insulating tape 350_2 attached to a part of the upper surface of the sealing member 330_2 may be spaced apart from the upper surface of the driver integrated circuit 310_2, and a protective resin 370_2 may be disposed in the gap. That is, the protective resin 370_2 may be disposed not only on side and lower surfaces of the driver integrated circuit 310_2 but also between the upper surface of the driver integrated circuit 310_2 and the lower surface of the insulating tape 350_2.

The insulating tape 350_2 may prevent the static electricity that can be generated in the driver integrated circuit 310_2 and, at the same time, form an enclosed space with the sealing member 330_2 so that the driver integrated circuit 310_2 can be protected by the protective resin 370_2. If the sealing member 330_2 is formed to have a lower height than the driver integrated circuit 310_2, the insulating tape 350_2 may be attached to the upper surface of the driver integrated circuit 310_2 and may not be firmly attached to the upper surface of the sealing member 330_2. In this case, a step may be formed in an area where the insulating tape 350_2 is attached to the sealing member 330_2. Due to the step, the insulating tape 350_2 may peel off, causing the protective resin 370_2 to leak out or the driver integrated circuit 310_2 to be exposed to outside air.

To prevent this, in the display device 10_2 according to an exemplary embodiment, the height H330_2 of the sealing member 330_2 may have a greater value than the height H310_2 from the upper surface of the driver integrated circuit 310_2 to the upper surface of the first circuit board 300. The insulating tape 350_2 may be spaced apart from the upper surface of the driver integrated circuit 310_2 but may be firmly attached to the upper surface of the sealing member 330_2 and may form an enclosed space with the sealing member 330_2. This can prevent the protective resin 370_2 from leaking out, prevent the driver integrated circuit 310_2 from being exposed to outside air, and prevent the static electricity that can be generated in the driver integrated circuit 310_2.

In addition, in some cases, the insulating tape 350_2 may be disposed to contact the upper surface of the driver integrated circuit 310_2. That is, in the display device 10_2 of FIG. 15, a central part of the insulating tape 350_2 may be attached to the upper surface of the driver integrated circuit 310_2.

Referring to FIG. 16, in a display device 10_3 according to an exemplary embodiment, at least a part of an upper surface of an insulating tape 350_3 may be sunken into the driver integrated circuit, and a lower surface of the sunken part may contact an upper surface of a driver integrated circuit 310_3. The display device 10_3 of FIG. 16 is the same as the display device 10_2 of FIG. 15 except that the insulating tape 350_3 is attached to the upper surface of the driver integrated circuit 310_3. Hereinafter, any redundant description will be omitted, and differences will be described.

As illustrated in FIG. 16, a central part of the insulating tape 350_3 may be sunken, and a lower surface of the central part may be attached to the upper surface of the driver integrated circuit 310_3. A step may be formed because the upper surface of the insulating tape 350_3 is partially sunken. However, since the insulating tape 350_3 is attached to an upper surface of a sealing member 330_3 and the upper surface of the driver integrated circuit 310_3, the peeling of the insulating tape 350_3 during a fabrication process of the display device 10_3 can be prevented. In addition, since an area to which the insulating tape 350_3 is attached is increased, a space that the insulating tape 350_3 forms with the sealing member 330_3 can be tightly sealed, and the driver integrated circuit 310_3 can be prevented from being exposed to outside air.

The sealing member 330_3 may be formed along the print layer SPL formed on the first circuit board 300 in the process of fabricating the display device 10_3. The print layer SPL may be spaced apart from the driver integrated circuit 310 and disposed to surround the driver integrated circuit 310. However, the print layer SPL may not necessarily surround the entire outer surface of the driver integrated circuit 310. According to an exemplary embodiment, the print layer SPL may include a plurality of print patterns (e.g., SPP_4, SPP_5), and the print patterns SPP may be spaced apart from each other to surround the outer surface of the driver integrated circuit 310. That is, the print layer SPL may partially surround the outer surface of the driver integrated circuit 310, and an area where the print layer SPL is not disposed to face the outer surface of the driver integrated circuit 310 may be formed.

Figure 17:
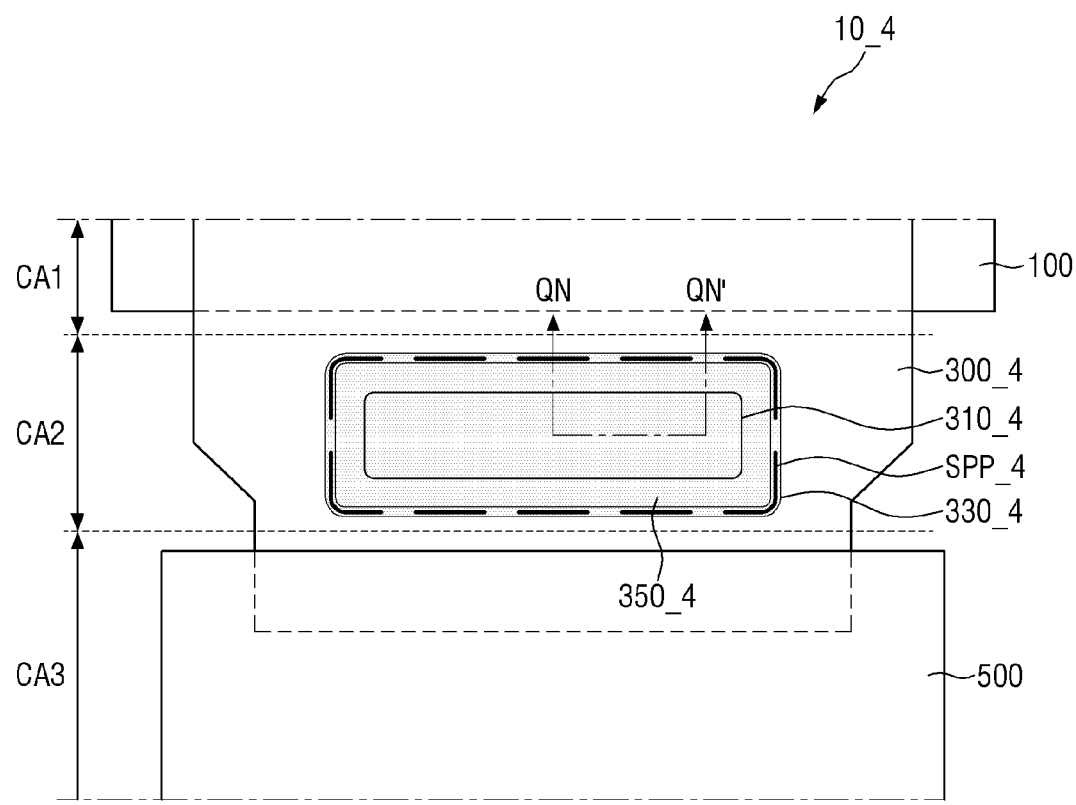
FIG. 17 is a partial plan view of a first circuit board of a display device according to an exemplary embodiment.
Figure 18:
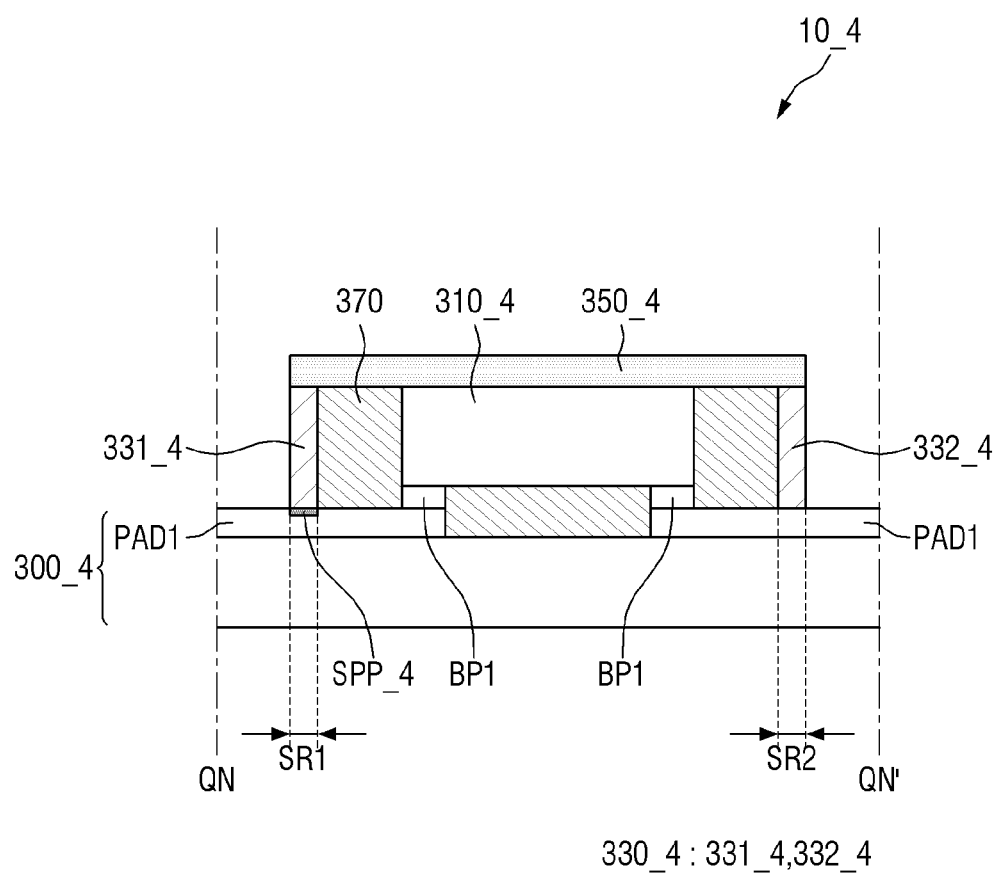
FIG. 18 is a cross-sectional view taken along line QN-QN' of FIG. 17.

FIG. 17 is a partial plan view of a first circuit board 300_4 of a display device 10_4 according to an exemplary embodiment. FIG. 18 is a cross-sectional view taken along line QN-QN' of FIG. 17. FIG. 18 illustrates a cross-section of the display device 10_4 of FIG. 17, taken along line traversing a print pattern SPP_4 and line partially traversing an upper surface of the first circuit board 300_4 on which print patterns SPP_4 are not disposed, Referring to FIGS. 17 and 18, the display device 10_4 according to the exemplary embodiment may include a plurality of print patterns SPP_4, and the print patterns SPP_4 may be spaced apart from each other and disposed to face an outer surface of a driver integrated circuit 310_4, The display device 10_4 of FIGS. 17 and 18 is the same as the display device 10 of FIG. 4 except that a print layer SPL includes a plurality of print patterns SPP_4. Hereinafter, any redundant description will be omitted, and differences will be described.

As illustrated in FIGS. 17 and 18, the print patterns SPP_4 may be disposed on the first circuit board 300_4. The print patterns SPP_4 may be spaced apart from each other, and each of the print patterns SPP_4 may be spaced apart from and face a part of the outer surface of the driver integrated circuit 310_4. The print patterns SPP_4 may be understood as constituting substantially one print layer SPL, and the driver integrated circuit 310_4 may be disposed in an area surrounded by the print patterns SPP_4.

Since the print layer SPL includes the print patterns SPP_4 spaced apart from each other, some parts of a sealing member 330_4 may be disposed on the print patterns SPP_4, and some part of the sealing member 3304 may be disposed directly on the first circuit board 300_4. For example, as illustrated in FIG. 18, the sealing member 330_4 may include a first sealing member 331_4 overlapping a first print area. SR1 where a print pattern SPP_4 is formed on the first circuit board 3004 and a second sealing member 3324 overlapping a second print area SR2 where no print pattern SPP_4 is formed and disposed directly on the first circuit board 300_4. The first sealing member 331_4 and the second sealing member 332_4 constitute substantially one sealing member 330_4 and may have been given different names to distinguish different parts of the sealing member 330_4. Since a plurality of print patterns SPP_4 are spaced apart from each other, the first sealing member 331_4 and the second sealing member 332_4 of the sealing member 330_4 may be alternately repeated in the sealing member 330_4.

The display device 10_4 of FIGS. 17 and 18 may be fabricated by moving a camera CM along the print patterns SPP_4 and injecting a sealant 330' using a first nozzle NZ1 moving in the same direction as the camera CM in the process of forming the sealing member 330_4, The camera CM may move along an area where a print pattern SPP_4 is formed (i.e., the first print area SR1). In an area where no print pattern SPP_4 is formed (i.e., second print area SR2) because the print patterns SPP_4 are spaced apart from each other, the camera CM may keep moving in the direction it moves along the print pattern SPP_4. For example, as illustrated in FIGS. 17 and 18, the second print area SR2 where no print pattern SPP_4 is disposed may extend in the first direction DR1 between print patterns SPP_4 spaced apart from each other in the first direction DR1. When the camera CM moving in a direction along one print pattern SPP_4 enters the second area SR2 at an end of the print pattern SPP_4, it may keep moving in the same direction. While the camera CM keeps moving in the direction, it may sense an end of another print pattern SPP_4 and thus move along the another print pattern SPP_4, The first nozzle NZ1 may inject the sealant 330' onto the print patterns SPP_4 and a gap between the print patterns SPP_4 while moving integrally with the camera CM. The sealing member 330_4 may be formed on an area into which the sealant 330' is injected (i.e., the first print area SR1 where a print pattern SPP_4 is formed and the second print area SR2 between print patterns SPP_4).

The display device 10_4 of FIGS. 17 and 18 may include a plurality of print patterns SPP_4 spaced apart from each other, and the sealing member 330_4 may include the first sealing member 331_4 formed on the first print area SR1 where a print pattern SPP_4 is disposed and the second sealing member 332_4 formed on the second print area SR2. The first sealing member 331_4 and the second sealing member 332_4 may be alternately disposed to form the sealing member 330_4, and the sealing member 330_4 may be disposed to surround the outer surface of the driver integrated circuit 310_4.

FIG. 19 is a partial plan view of a first circuit board 300_5 of a display device 10_5 according to another exemplary embodiment.

Referring to FIG. 19, the display device 10_5 according to an exemplary embodiment may include a plurality of print patterns SPP_5, and each of the print patterns SPP_5 may be disposed to face a corner where sides of a driver integrated circuit 310_5 meet. The display device 10_5 of FIG. 19 is the same as the display device 10_4 of FIG. 18 except for the positions of the print patterns SPP_5. Hereinafter, any redundant description will be omitted, and differences will be described.

As illustrated in FIG. 19, each of the print patterns SPP_5 may be disposed to face a corresponding corner of the driver integrated circuit 310_5. In a fabrication process of the display device 10_5, a sealing member 330_5 may be formed along a print pattern. SPP_5 such that it is spaced apart from and faces a corresponding corner of the driver integrated circuit 310_5. In an area where no print pattern SPP_5 is formed, a first nozzle NZ1 may form the sealing member 330_5 while moving in a direction, e.g., the first direction DR1 or the second direction DR2 from an end of the print pattern SPP_5. The first nozzle NZ1 moving in the direction may form the sealing member 330_5 along a print pattern SPP_5 facing another corner of the driver integrated circuit 310_5. That is, even if the display device 10_5 according to the exemplary embodiment includes the print patterns SP_5 facing some parts of the driver integrated circuit 310_5, the sealing member 330_5 can be formed to surround an outer surface of the driver integrated circuit 310_5 at a predetermined distance from the outer surface of the driver integrated circuit 310_5.

Figure 20:
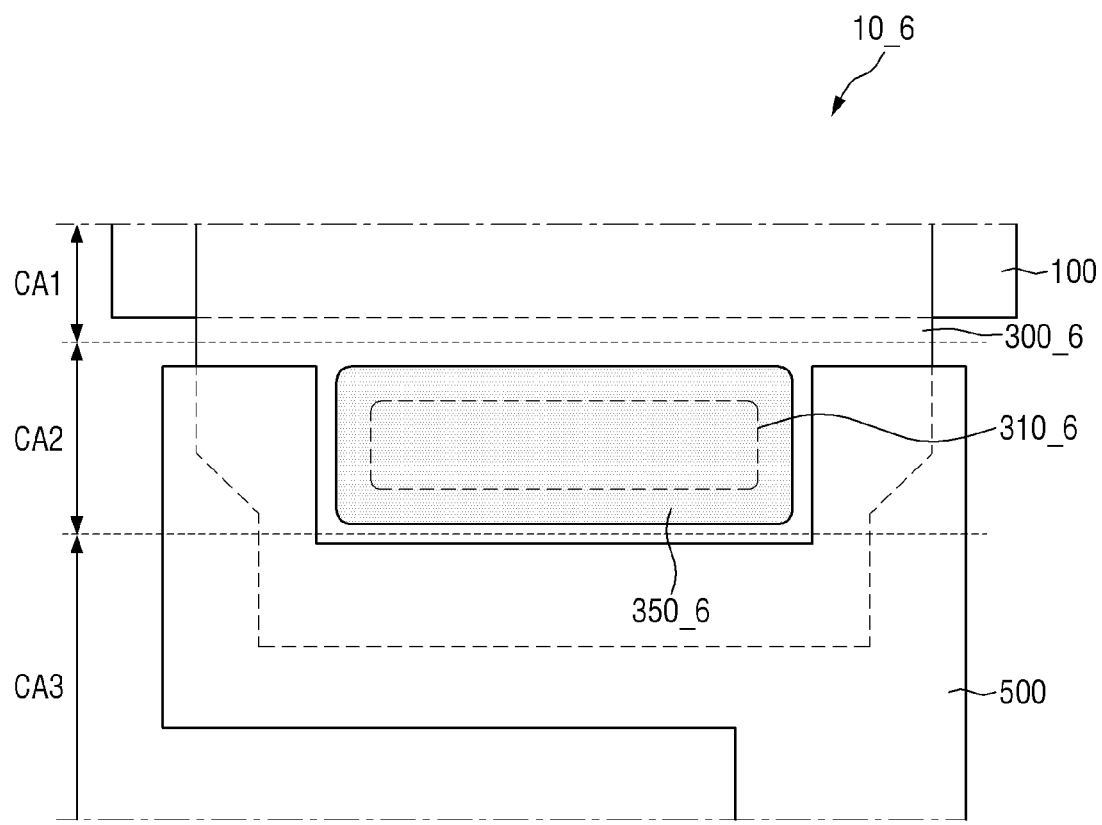
FIG. 20 is a partial plan view of a display device according to an exemplary embodiment.

FIG. 20 is a partial plan view of a display device 10_6 according to an exemplary embodiment.

Referring to FIG. 20, in the display device 10_6 according to the exemplary embodiment, a second circuit board 500_6 may be attached to parts of a third area. CA3 and a second area CA2 of a first circuit board 300_6. The second circuit board 500_6 may surround one side of a sealing member 330 (not illustrated) extending in the first direction DR1 and both sides, connected to both ends of the one side and extending in the second direction DR2, of a sealing member 330 and may be spaced apart from the one side and the both sides.

As described above, in the display device 10_6 according to the exemplary embodiment, since an insulating tape 350_6 is attached to an upper surface of the sealing member 330, a space in which the second circuit board 500_6 may be disposed can be increased on the first circuit board 300_6. Unlike in the display device 10 of FIG. 4, in the display device 10_6 of FIG. 20, the second circuit board 500_6 may be disposed to cover a part of the second area CA2, that is, a part of the second area CA2 near the both sides of the sealing member 330 extending in the second direction DR2. The second circuit board 500_6 may be spaced apart from a plurality of sides of the sealing member 330.

A display device according to an exemplary embodiment includes a sealing member which surrounds a driver integrated circuit and an insulating tape which is disposed on the sealing member and the driver integrated circuit. The insulating tape may be attached to at least an upper surface of the sealing member to cover the driver integrated circuit together with the sealing member. Accordingly, the driver integrated circuit can be protected from being exposed to outside air, and the insulating tape can prevent static electricity that can be generated in the driver integrated circuit.

In addition, since the insulating tape is disposed on the sealing member, a space to which another circuit board may be attached can be secured on a circuit board on which the driver integrated circuit is disposed.

In concluding the detailed description, those skilled in the art will appreciate that many variations and modifications can be made to the preferred exemplary embodiments without substantially departing from the principles of the present invention. Therefore, the disclosed preferred exemplary embodiments of the invention are used in a generic and descriptive sense only and not for purposes of limitation.

What is claimed is:

1. A display device comprising:
 a display panel;
 a first circuit board which has a first end attached onto the display panel;
 a driver integrated circuit which is disposed on the first circuit board;
 a sealing member disposed on the first circuit board and which surrounds an outer surface of the driver integrated circuit; and
 an insulating tape which is disposed on the sealing member and the driver integrated circuit.

2. The display device of claim 1, wherein the insulating tape overlaps the driver integrated circuit and is attached onto at least a part of an upper surface of the sealing member.

3. The display device of claim 2, wherein a side surface of the insulating tape forms a level surface with a side surface of the sealing member.

4. The display device of claim 2, wherein a height of the sealing member is greater than a height measured from an upper surface of the first circuit board to an upper surface of the driver integrated circuit.

5. The display device of claim 4, wherein at least a part of an upper surface of the insulating tape is sunken into the driver integrated circuit, and a lower surface of the sunken part contacts the upper surface of the driver integrated circuit.

6. The display device of claim 1, further comprising a protective resin which is disposed between the insulating tape and the first circuit board in an area surrounded by the sealing member.

7. The display device of claim 6, wherein the protective resin is disposed between the driver integrated circuit and the sealing member.

8. The display device of claim 6, wherein the protective resin is disposed between the upper surface of the driver integrated circuit and the insulating tape.

9. The display device of claim 1, further comprising a second circuit board which is attached onto a second end, opposite the first end, of the first circuit board.

10. The display device of claim 9, wherein the second circuit board is spaced apart from the sealing member.

11. The display device of claim 10, wherein the second circuit board surrounds one side of the sealing member and both sides, connected to both ends of the one side, of the sealing member and is spaced apart from the one side and the both sides.

12. The display device of claim 1, further comprising a print layer which is formed on the first circuit board to be spaced apart from the driver integrated circuit,
wherein at least a part of the print layer surrounds the outer surface of the driver integrated circuit, and
at least portion of the sealing member partially overlaps the print layer.

13. The display device of claim 12, wherein the print layer comprises one or more print patterns, and the print patterns are spaced apart from each other and face the outer surface of the driver integrated circuit.

14. The display device of claim 13, wherein the sealing member comprises a first area overlapping a print pattern of the one or more print patterns and a second area adjacent to the first area and not overlapping the one or more print patterns.

15. A display device comprising:
a display panel which comprises a display area, a non-display area surrounding the display area, and a coupling area disposed on a side of the non-display area;
a first circuit board which has a first end attached onto the coupling area of the display panel;
a second circuit board which is attached onto a second end, opposite the first end, of the first circuit board;
a driver integrated circuit which is disposed on the first circuit board to be spaced apart from the second circuit board;
a print layer which is formed on the first circuit board to surround the driver integrated circuit at a distance from the driver integrated circuit;
a sealing member which is disposed on the print layer to surround the driver integrated circuit and disposed between the driver integrated circuit and the second circuit board;
an insulating tape which is disposed on the sealing member and the driver integrated circuit; and
a protective resin which is disposed between the insulating tape and the first circuit board in an area surrounded by the sealing member.

16. The display device of claim 15, wherein the insulating tape overlaps the driver integrated circuit and is attached onto at least a part of an upper surface of the sealing member.

17. The display device of claim 16, wherein the second circuit board surrounds one side of the sealing member and both sides, connected to both ends of the one side, of the sealing member and is spaced apart from the one side and the both sides.

18. A method of fabricating a display device, the method comprising:
preparing a first circuit board having a print layer formed on at least a part of the first circuit board;
placing a driver integrated circuit in an area surrounded by the print layer and forming a sealing member on the print layer; and
injecting a protective resin into an area surrounded by the sealing member and placing an insulating tape on the sealing member and the driver integrated circuit.

19. The method of claim 18, wherein the forming of the sealing member comprises:
moving a camera, which senses a position of the print layer formed on the first circuit board, along the print layer; and
injecting a sealant onto the print layer using a first nozzle moving in a same direction as the camera.

20. The method of claim 19, wherein in the placing of the insulating tape, the insulating tape is attached to at least a part of an upper surface of the sealing member.

* * * * *